United States Patent [19]

Asmussen et al.

[11] Patent Number: 4,727,293
[45] Date of Patent: Feb. 23, 1988

[54] PLASMA GENERATING APPARATUS USING MAGNETS AND METHOD

[75] Inventors: Jes Asmussen, Okemos; Donnie K. Reinhard; Mahmoud Dahimene, both of East Lansing, all of Mich.

[73] Assignee: Board of Trustees operating Michigan State University, East Lansing, Mich.

[21] Appl. No.: 849,052

[22] Filed: Apr. 7, 1986

Related U.S. Application Data

[63] Continuation-in-part of Ser. No. 641,190, Aug. 16, 1984, Pat. No. 4,585,668, which is a continuation-in-part of Ser. No. 468,897, Feb. 23, 1983, Pat. No. 4,507,588.

[51] Int. Cl.⁴ .................... H01J 7/24; H05B 31/26
[52] U.S. Cl. .................... 315/111.41; 315/111.71; 315/111.81; 313/362.1; 313/231.31
[58] Field of Search .................. 315/111.41, 111.71, 315/111.81, 111.91, 111.21, 111.31, 39; 313/231.3, 360.1, 362.1

[56] References Cited

U.S. PATENT DOCUMENTS

| | | | |
|---|---|---|---|
| 3,230,418 | 1/1966 | Dandl et al. | 315/111.41 X |
| 4,507,588 | 3/1985 | Asmussen et al. | 315/111.41 |
| 4,559,477 | 12/1985 | Leung et al. | 315/111.41 |
| 4,585,668 | 4/1986 | Asmussen et al. | 427/38 |
| 4,598,231 | 7/1986 | Matsuda et al. | 315/111.81 |
| 4,611,121 | 9/1986 | Miyamura et al. | 315/111.41 |
| 4,630,566 | 12/1986 | Asmussen et al. | 315/111.41 |
| 4,631,438 | 12/1986 | Jacquot | 315/111.71 |

FOREIGN PATENT DOCUMENTS

| | | | |
|---|---|---|---|
| 0054621 | 6/1982 | European Pat. Off. | 315/111.81 |
| 0184812 | 6/1986 | European Pat. Off. | 315/111.71 |

Primary Examiner—Saxfield Chatmon
Attorney, Agent, or Firm—Ian C. McLeod

[57] ABSTRACT

An improved ion generating apparatus for producing a plasma disk using magnets 34 and 35 around a region 16 in a chamber 15 positioned in a microwave cavity is described. The apparatus is particularly operated at a microwave frequency such that electron cyclotron resonance is produced in the plasma to create an accelerating surface for the electrons around and inside of the plasma. The apparatus can be operated to treat an article 100 in the plasma or a holder 39, with a grid 51 to withdraw particles or with a magnets 47 around an opening 48 forming a nozzle which with electron cyclotron resonance produces a neutral beam of charged particles. The apparatus is particularly useful as a plasma source especially for oxidation, etching and deposition.

27 Claims, 11 Drawing Figures

PLASMA GENERATING APPARATUS USING MAGNETS AND METHOD

CROSS-REFERENCE TO RELATED APPLICATION

This application is a continuation-in-part of application Ser. No. 641,190, filed Aug. 16, 1984, now U.S. Pat. No. 4,585,668, which is a continuation-in-part of Ser. No. 468,897 filed Feb. 23, 1983, now U.S. Pat. No. 4,507,588.

BACKGROFUND OF THE INVENTION (1) Field of the Invention

The present invention relates to an improved plasma generating apparatus and method which uses magnets to establish a multicusp static magnetic field around the plasma region which is inside an insulated chamber. In particular, the present invention relates to an apparatus and method which uses the magnets to aid in confining the plasma in the chamber and also produces electron cyclotron resonance (ECR) zones within the chamber which impart energy to the electrons in the plasma.

(2) Prior Art

The present invention relates to an improvement on the plasma generating apparatus described in U.S. Pat. No. 4,507,588 by some of the inventors herein. This patent disclosed some confining magnetic field configurations without detail as to the mounting of the magnets. The radial positioning of the elongate magnets on the sliding short was effective in confining the charged particles, particularly the electrons; however, electron cyclotron resonance (ECR) was not discussed.

OBJECTS

It is therefore an object of the present invention to provide a plasma generating apparatus which includes improved means for mounting of magnets for confining the plasma. Further it is an object of the present invention to provide a plasma generating apparatus which uses electron cyclotron resonance (ECR) to impart energy to the plasma at very low pressures ($\leq 10$ microns). These and other objects will become increasingly apparent by reference to the following description and the drawings.

IN THE DRAWINGS

FIG. 1 is a front partial cross-sectional view of the preferred plasma generating apparatus particularly illustrating the positioning of the magnets 34 and 35 in relation to a dish or chamber 15 to provide magnetic cusps 16a inside the dish.

Figure 6:
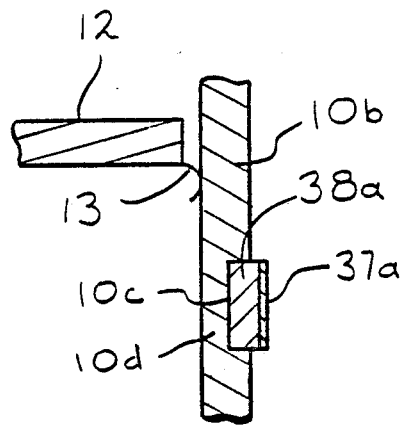

FIG. 6 is a front partial cross-sectional view of the sliding short 12b and cylinder 10b wherein the magnets 38a are mounted in the cylinder 10b.

Figure 7:
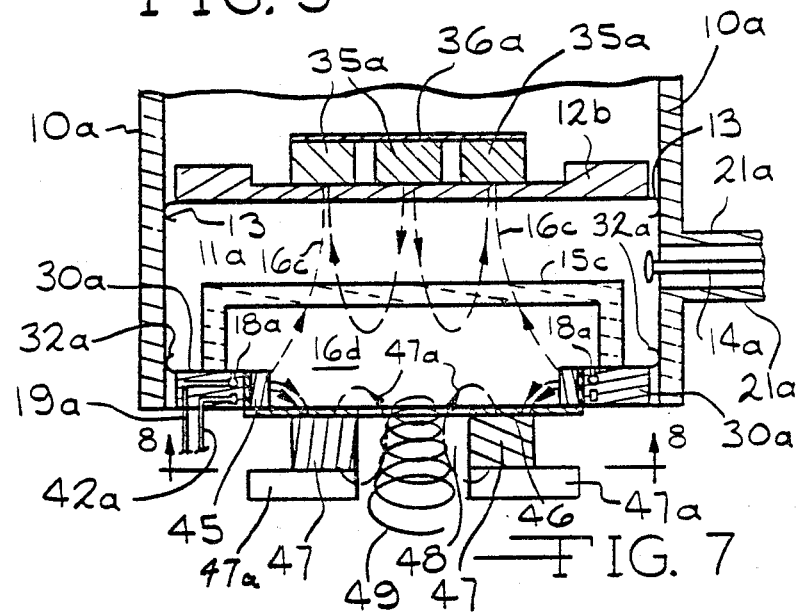

FIG. 7 is a front partial cross-sectional view of a modified plasma generating apparatus wherein magnets 47 surround an opening 48 in the plasma region 16d which acts as a magnetic nozzle directing electrons and ions out of the plasma region.

Figure 8:
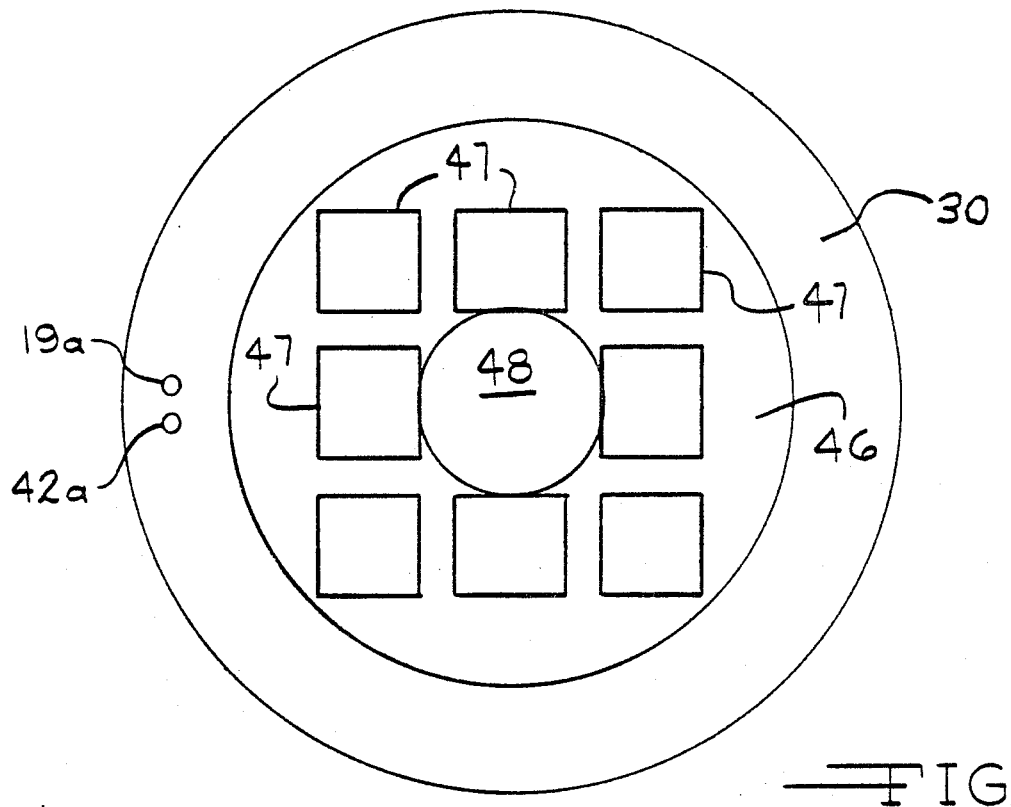

FIG. 8 is a plan view along line 8—8 of FIG. 7.

Figures 9, 10:
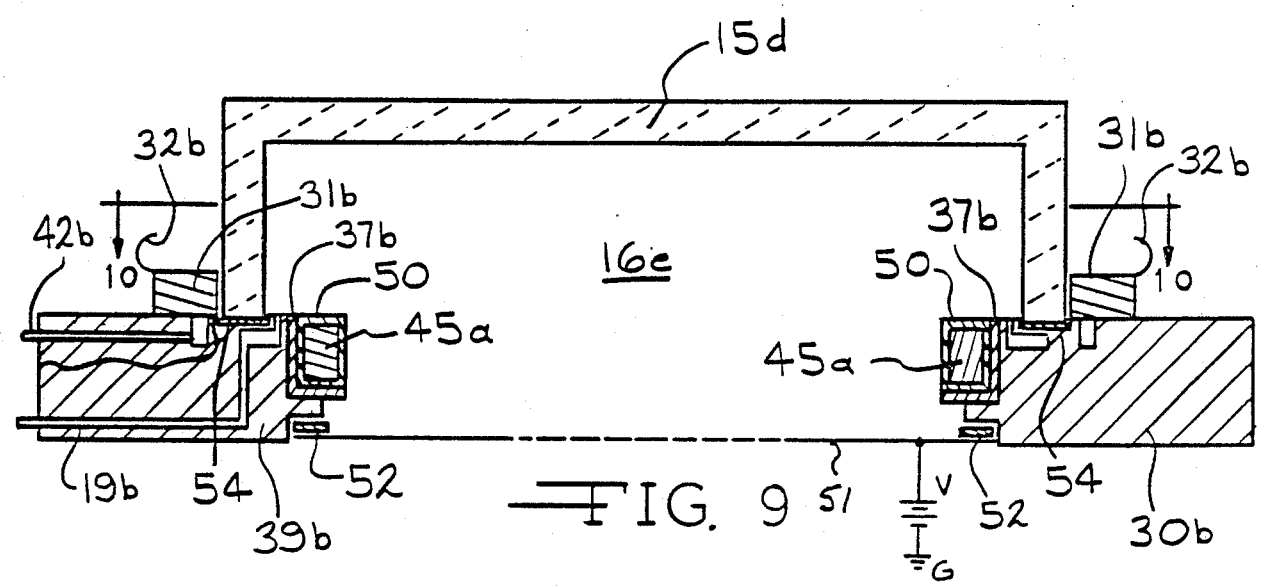

FIG. 9 is a front cross-sectional view of a modified base 30b for a plasma generating apparatus wherein shielded magnets 45a are provided inside the plasma region 16e.

FIG. 10 is a plan cross-sectional view along line 10—10 of FIG. 9.

Figure 11:
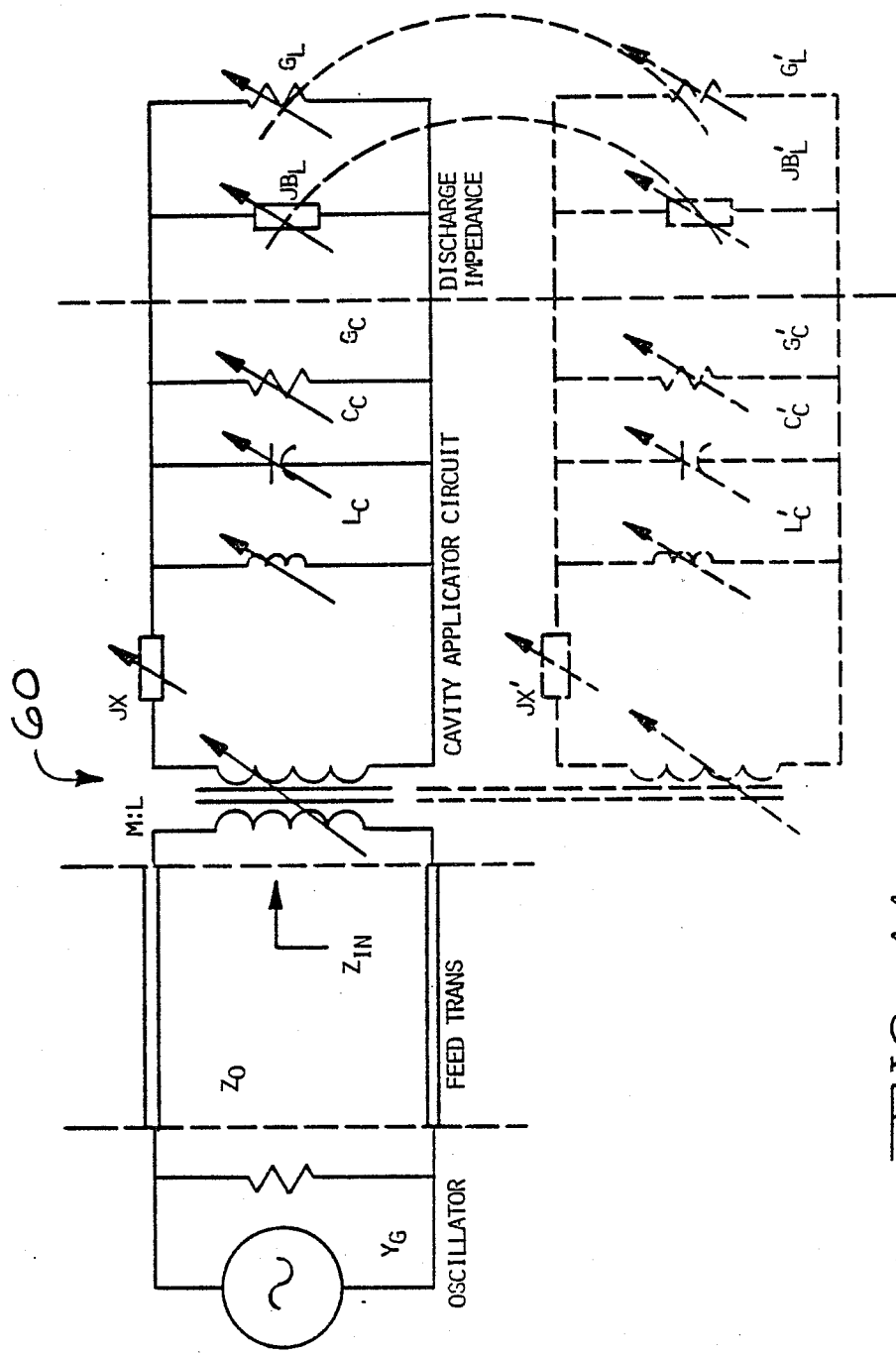

FIG. 11 is an equivalent electrical circuit diagram which approximates the circuit elements of the plasma generating apparatus which is presented for the purpose of describing the operation of the apparatus.

GENERAL DESCRIPTION

The present invention relates to a plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a moveable plate means of a non-magnetic metal in the cavity mounted perpendicular to the axis of the chamber and moveable towards and away from the chamber as a sliding short, including a moveable probe connected to and extending inside the coupler for coupling the radio frequency waves to the coupler, wherein movement of the moveable plate means and the probe in the coupler achieves the selected TM or TE mode of resonance of the radio frequency wave in the coupler and varies the resonance of the mode and wherein the radio frequency wave applied to the coupler creates and maintains the plasma at reduced pressures in the shape of an elongate plasma disk perpendicular to and surrounding the central longitudinal axis in the chamber, the improvement which comprises: a plurality of first magnets mounted on the apparatus around the longitudinal axis of the chamber on a ring of high permeability magnetic material so as to create magnetic cusps in the chamber which aid in confining the plasma in the chamber; and second magnets mounted on a sheet of high permeability magnetic material in the apparatus so as to provide magnetic cusps inside the chamber which aid in confining the plasma in the chamber.

Further the present invention relates to a plasma generating apparatus which comprises: a plasma source employing a radio frequency, including UHF or microwave, wave coupler which is metallic and non-magnetic and in the shape of a hollow cavity which can be excited in one or more TE or TM modes of resonance; an electrically insulated chamber having a central longitudinal axis and mounted in the coupler; gas supply means for providing a gas which is ionized to form the plasma in the insulated chamber; a movable probe connected to and extending inside the coupler for coupling the radio frequency waves to the coupler; a plurality of first magnets mounted around the longitudinal axis of the chamber on a ring of high permeability magnetic material so as to create magnetic cusps in the chamber which aid in confining the plasma in the chamber; movable metal plate means as a sliding short in the cavity which is non-magnetic mounted perpendicular to the axis and movable towards and away from the chamber; second magnets mounted on a sheet of high permeability magnetic material and on the plate means so as to provide magnetic cusps inside the chamber which aid in confining the plasma in the chamber; and wherein movement of the plate means and the probe in the coupler achieves the selected TE or TM mode of resonance of the radio frequency wave in the coupler and varies the resonance of the mode and wherein the radio frequency wave applied to the coupler creates and maintains the plasma at reduced pressures in the shape of an elongate plasma disk perpendicular to and surrounding the central longitudinal axis in the chamber which is confined in the chamber by the magnetic cusps.

Further still the present invention relates to a method for forming a plasma which comprises: a plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a moveable plate means of a non-magnetic metal in the cavity mounted perpendicular to the axis of the chamber and moveable towards and away from the chamber as a sliding short, including a moveable probe connected to and extending inside the coupler for coupling the radio frequency waves to the coupler, wherein movement of the moveable plate means and the probe in the coupler achieves the selected TM or TE mode of resonance of the radio frequency wave in the coupler and varies the resonance of the mode and wherein the radio frequency wave applied to the coupler creates and maintains the plasma at reduced pressures in the shape of an elongate plasma disk perpendicular to and surrounding the central longitudinal axis in the chamber, the improvement which comprises: a plurality of first magnets mounted on the apparatus around the longitudinal axis of the chamber on a ring of high permeability magnetic material so as to create magnetic cusps in the chamber which aid in confining the plasma in the chamber; and second magnets mounted on a sheet of high permeability magnetic material so as to provide magnetic cusps inside the chamber which aid in confining the plasma in the chamber; and forming the plasma disk in the chamber confined by the magnetic cusp.

Preferably the present invention utilizes rare earth magnets with a field strength between about 0.01 and 0.5 Tesla. Superconducting magnets can also be used to produce even higher magnetic field strengths. In this later case, the applied magnetic fields can be varied (by varying coil currents) to provide an optimum magnetic field geometry. The magnetic field strength is preferably:

$$B \geq \omega^m e/e$$

$\omega = 2\pi f$ and f is the cavity excitation frequency. $m_e$ is the mass of the electron and e is the magnitude of the charge of the electron.

While the apparatus described in U.S. Pat. No. 4,507,588 works without an applied static magnetic field, the addition of a magnetic field is a variation of the technology that has advantages for many potential applications. These advantages are: (1) a reduction of charged particle diffusion losses resulting in higher discharge efficiencies, (2) providing ECR zones in the discharge volume thereby enhancing electromagnetic coupling to the discharge at low pressures (<10 microns) and low input gas flow rates, (3) control of discharge uniformity by spatially adjusting the ECR zones, (4) creating a group of high energy electrons yielding different plasma chemistry than microwave discharges without ECR magnetic fields and (5) providing a method for discharge ignition at low pressures, i.e., electron cyclotron resonance breakdown. This is an important feature of the present invention which allows easy starting of the plasma discharge at low pressures.

The design approach for the microwave plasma/ion sources described here is similar to that described in earlier U.S. Pat. No. 4,507,588. A microwave discharge is created in a disk shaped discharge plasma region which is separated from the applicator (cavity) aperture (or antenna) by a quartz confining enclosure or disk. The applicator is in the shape of a hollow, cylindrical cavity which focuses and matches the microwave energy into the plasma region utilizing single or controlled multimode electromagnetic excitation and "internal cavity" matching. This apparatus can be used as a broad-beam ion source or as a plasma source for materials processing.

SPECIFIC DESCRIPTION

Figure 1:
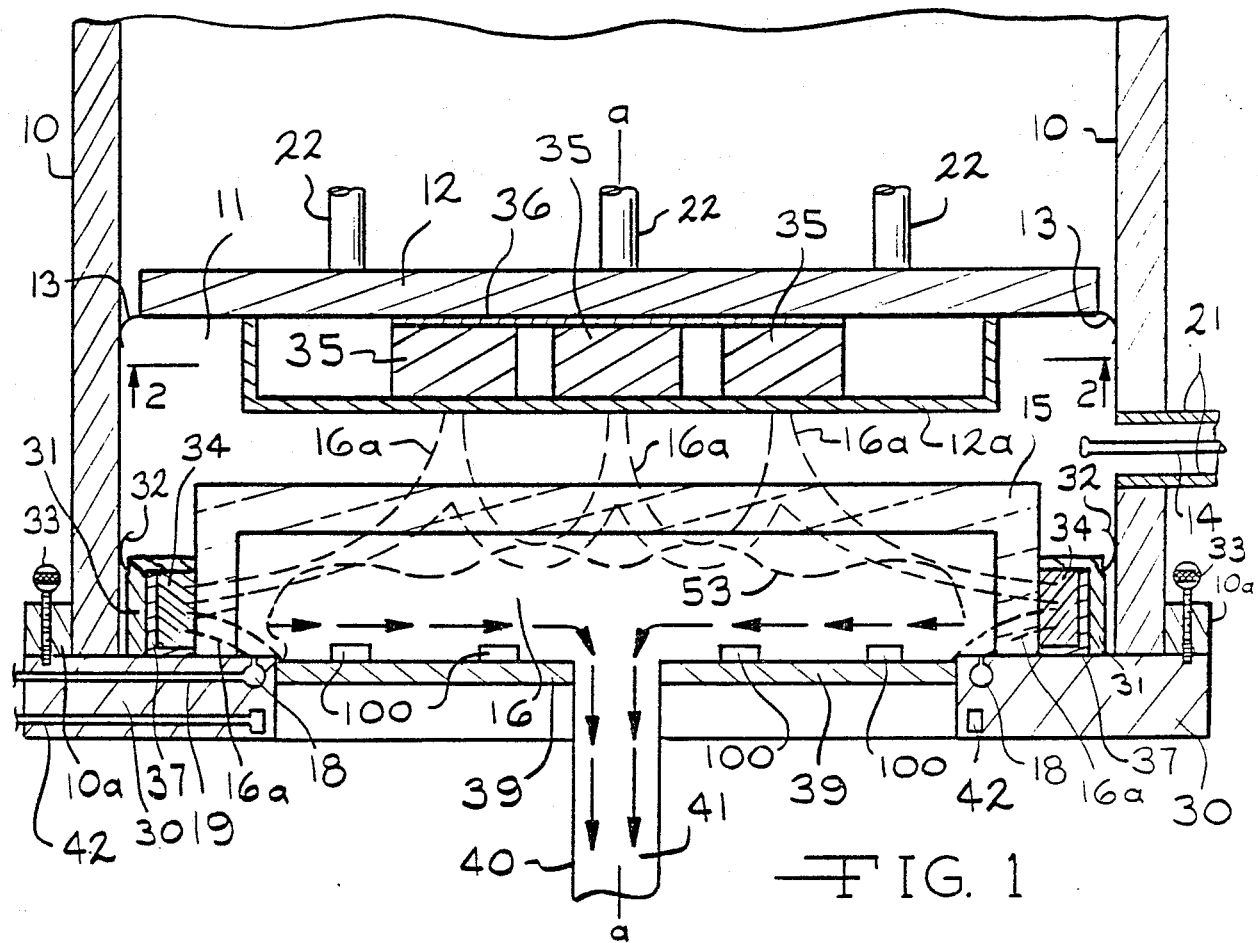
Figure 2:
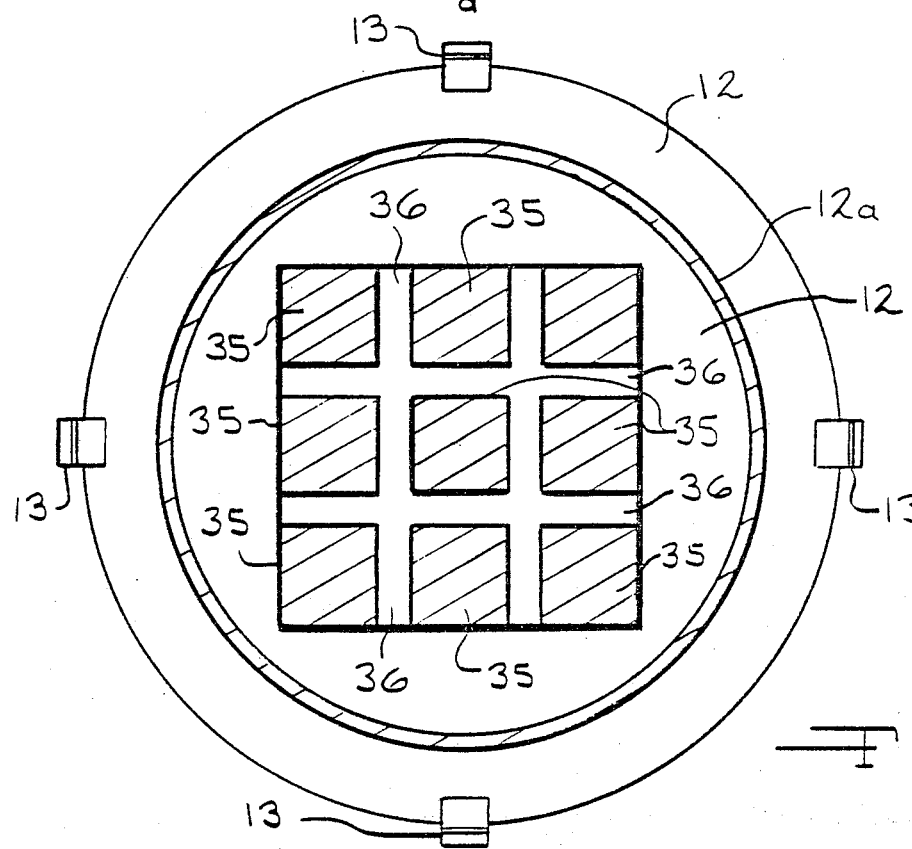
FIG. 2 is a plan cross-sectional view along line 2—2 of FIG. 1.

FIGS. 1 and 2 show the preferred improved plasma generating apparatus of the present invention. The basic construction of the apparatus without the magnet mountings shown is described in U.S. Pat. No. 4,507,588. It will be appreciated that various non magnetic materials can be used in the construction of the apparatus, such as copper, brass, aluminum, silver, gold, platinum, non-magnetic stainless steel and the like.

The apparatus includes copper or brass cylinder 10 forming the microwave cavity 11 with a copper or brass sliding short 12 for adjusting the length of the cavity 11. Silver plated copper brushes 13 electrically contact the cylinder 10. The brushes 13 are provided entirely around the circumference of the sliding short 12; however, in FIG. 2 only 4 are shown. Moveable excitation probe 14 provides impedance tuning of the microwave energy in the cavity 11. The probe 14 is mounted in cavity 11 by brass or copper conduit 21. Radial penetration of the probe 14 into the cavity 11 varies the coupling to the plasma in the cavity 11. Sliding short 12 is moved back and forth in cavity 11 to aid in tuning the microwave by rods 22 using conventional adjustment means (not shown) such as described in U.S. Pat. No. 4,507,588.

A quartz dish or chamber 15 shaped like a petri dish or round bottle bottom defines the plasma region 16 along with a stainless steel base 30 and holder 39. The holder 39 can have an electrical bias (not shown), which can be D.C. or R.F. to attract ions from the plasma. Gas is fed by tube 19 to annular ring 18 and then flows into the plasma region 16. Optionally a cooling line 42 is provided which cools the base 30. The cylinder 10 slides onto the base 30 and is held in place on base 30 by copper or brass ring 10a secured to the cylinder 10. Sliding silver plated copper brushes 32 mounted on a brass ring 31 contact the cylinder 10 to provide good electrical contact. The ring 10a is held in place on base 30 by copper or brass bolts 33. This construction allows the base 30 and dish 15 to be removed from the cylinder 10. The basic device operates without magnets as described in U.S. Pat. No. 4,507,588.

In the improved plasma apparatus, the dish 15 and plasma region 16 are surrounded by magnets on three sides. In the preferred embodiment, eight (8) or more equally spaced magnets 34 surround the dish 15 around axis a—a. A second set of magnets 35 is mounted on sliding short 12 by means of a thin aluminum cup 12a. The combination of the magnets 34 and 35 provide interconnected magnetic field cusps 16a in the plasma region 16 of the dish 15 as shown in FIG. 1. The magnets 34 and 35 reduce particle diffusion losses from region 16 inside the dish 15. The magnetic field strength decreases as the longitudinal axis a—a and center of the plasma region 16 is approached because of the positioning of the magnets 34 and 35.

The magnets 34 are mounted on a high magnetic permeability (iron) ring 37 around the ring 31 and held in place by magnetic attraction. The iron ring 37 is secured to brass ring 31 such as by soldering. The ring 37 partially surrounds the magnets 34 in an "L" shape so that the magnetic cusps 16a extends into dish 16 and then terminates at the bottom leg of the "L". The magnets 35 are held in place on a high magnetic permeability (iron) circular plate 36. The plate 36 is fastened to sliding short 12.

One end of the dish 15 adjacent the holder 39 is free of magnets. In this region, grids (not shown) or an article 100 to be treated is mounted on holder 39 as described in Ser. No. 641,190, filed Aug. 16, 1984. Gases pass out the opening 41 in tube 40 from the plasma region 16. The magnets 34 and 35 thus surround the dish 15. The plasma region 16 is surrounded by the interconnected magnetic cusps 16a.

Figure 3:
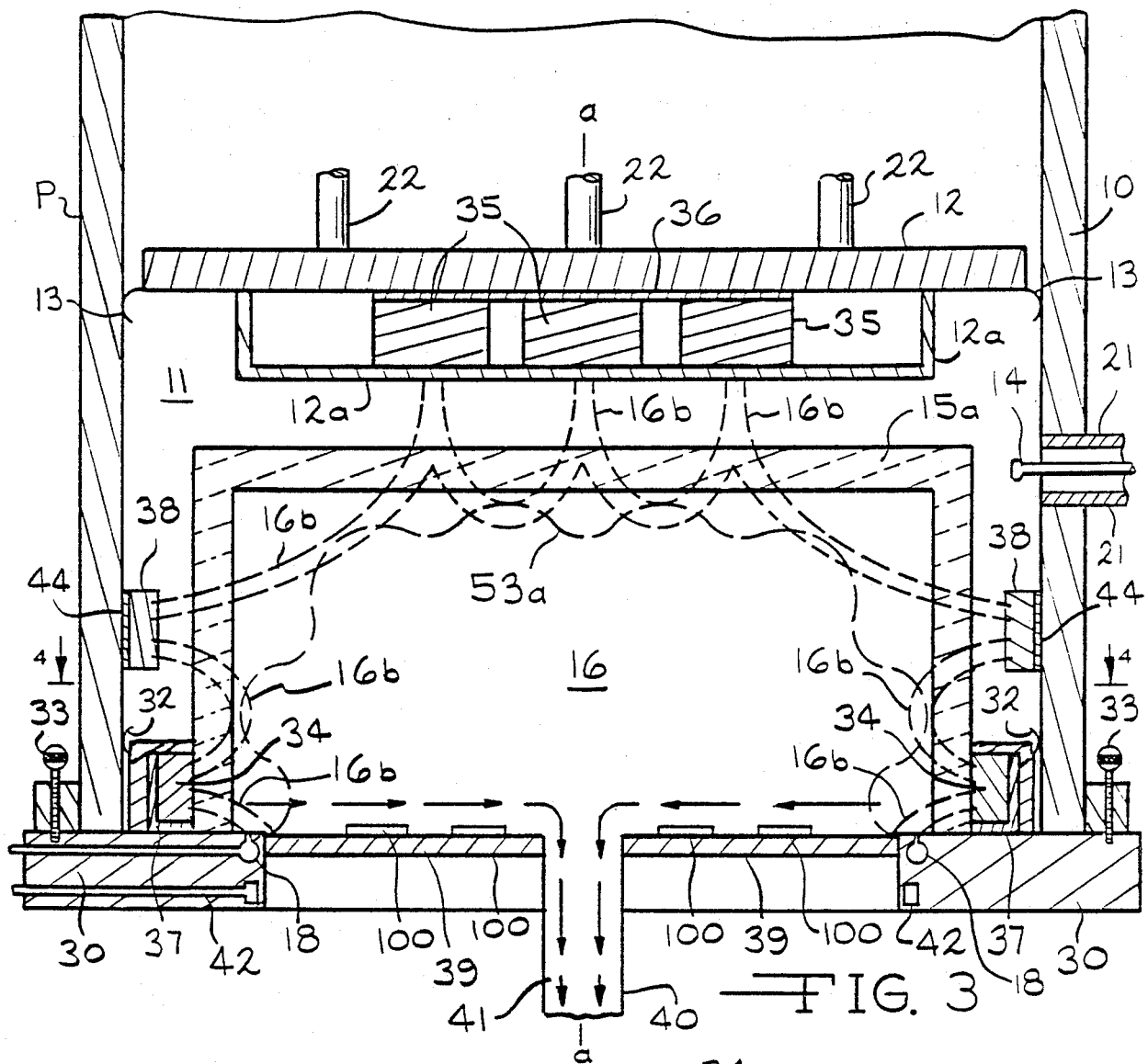
FIG. 3 is a front partial cross-sectional view of a modified plasma generating apparatus of the present invention wherein additional magnets 38 are provided around the dish 15.
Figure 4:
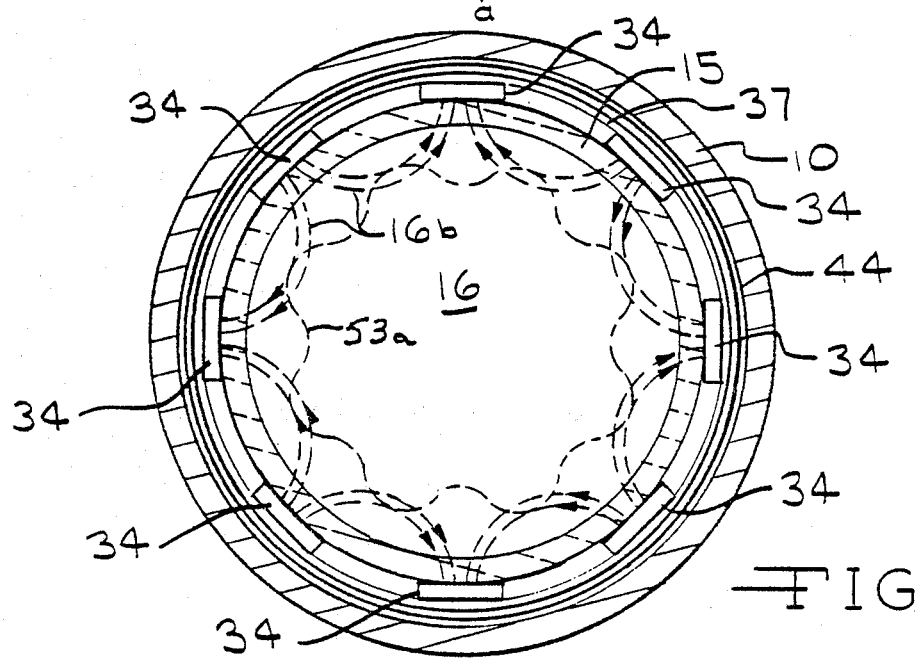
FIG. 4 is a plan cross-sectional view along line 4—4 of FIG. 3.

FIGS. 3 and 4 show a variation of the device of FIGS. 1 and 2 wherein the dish 15a is taller along the axis a—a. In this embodiment, additional magnets 38 are mounted on high magnetic permeability (iron) ring 44 secured to cylinder 10. This allows the magnetic cusps 16b to join together as shown by FIGS. 3 and 4 in a manner similar to that shown in FIG. 1. The remaining construction of FIGS. 3 and 4 is otherwise identical to that of FIGS. 1 and 2.

In the following description, letters beside the reference numbers are used for elements functionally identical to those of FIGS. 1 to 4. Where the function is the same, they are not necessarily redescribed.

Figure 5:
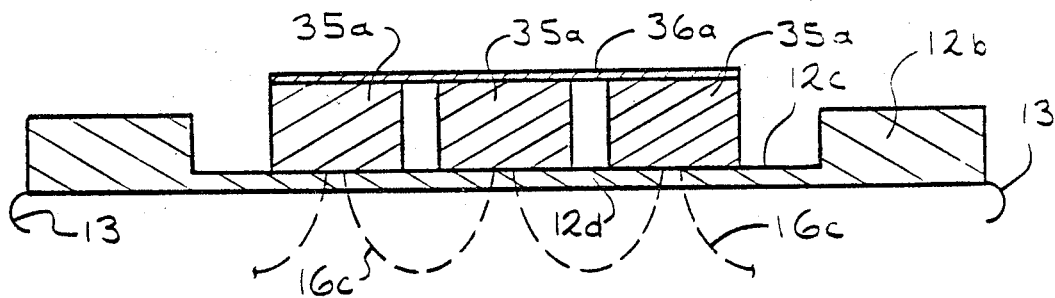
FIG. 5 is a cross-sectional view of a sliding short 12 wherein the magnets 35a are mounted on the short.

FIGS. 5 and 7 show a modified brass or copper sliding short 12b with a recess 12c which supports magnets 35a on a thin portion 12d. The magnets 35a are positioned on a circular iron plate 36a. In this modification, the thin portion 12d allows the magnetic cusps 16c to form inside the dish 15c. FIG. 6 shows a variation wherein the magnets 38a are mounted in slots 10c in cylinder 10b with a thin portion 10d which allows the magnetic cusps (not shown) to penetrate the dish (not shown). High magnetic permeability ring 37a holds the magnets 38a in place on the cylinder 10b. Thus there are a number of ways of mounting the magnets 34, 35, 35a, 38 and 38a on the cylinder 10, 10a or 10b and sliding short 12, 12a or 12b. The magnets 35 do not have to be mounted on the cylinder 10 or short 12 and can be independently mounted in or outside of the cavity 11. So long as the cavity is constructed of a nonmagnetic material, the magnetic cusps will penetrate the dish 15, 15a or 15b confining the plasma region 16 or 16d if they are sufficiently strong and properly positioned.

FIGS. 7 and 8 also show the use of magnets 45 located in the plasma region 16d inside the dish 15 and also show magnets 47 surrounding an opening 48 in a non-magnetic plate 46. The magnets 47 are sealed from the plasma by a covering (not shown) and are secured to an iron ring 47a. In this configuration, the magnets 45 and 47 produce a reduced magnetic field region in opening 48 allowing the high energy electrons to pass through the opening 48. The reduced field region in the opening 48 thus allows electrons to be accelerated from the plasma 16d and the ions are pulled along by electrostatic forces through the opening 48. This provides thrust such as for an ion engine or it can be used for ion treatment.

FIGS. 9 and 10 show a dish 15d defining a plasma region 16e. Magnets 45a are provided around and in the region 16e and are encased in a thin stainless steel shield 50 to prevent exposure to the plasma in the region 16e. A voltage biased grid 51 is mounted on a ring insulator 52 to isolate the grid 51. The grid 51 attracts ions from the plasma region 16e. The plasma apparatus of FIGS. 9 and 10 otherwise has the same construction as FIG. 1 and 2 where the letters inside the numbers have been used to identify functionally identical elements.

FIG. 11 shows the equivalent electrical circuit of the cavity 11 and plasma region 16 in dish 15. This is discussed more fully hereinafter.

One end of the disk shaped discharge region 16 is free of magnets. It is in this region where the grid 51 (FIG. 9) for ion extraction or the processing of material 100 on plate 39 (FIG. 1) is located. The type, positions and connections of the grids/or processing plate are as described in U.S. Pat. No. 4,507,588 and application Ser. No. 641,190. It is important to note however, that the static magnetic field at the grid 51 or plate 39 locations is made very low ($<50$ gauss to zero) by placing a lip on the ring 37. This "shorts out" the magnetic field from the adjacent strong magnets 34. The array of alternating poles of magnets 35 also produce little static magnetic field in the location of the grids 51 or plate 39.

It is well known that at electron cyclotron resonance (ECR) energy can be efficiently transferred from an electromagnetic field to electrons. In the plasma region 16 this energy in turn is transferred to the electron gas via electron-electron and electron heavy molecule collisions or to the heavier ion and neutral gases via electron-ion and electron-neutral collisions. ECR occurs when the exciting radian frequency $\omega$ equals the cyclotron radian frequency $\omega_b$.

$$\omega_b = eB/m_e$$

wherein
  e is the magnitude of the charge of the electron
  $m_e$ is the mass of the electron
  B is the static magnetic field strength.
Expressed in terms of frequency $$f_b = 28 \times 10^9 \text{ Hz/Tesla}$$

Thus, for an exciting frequency of $2.45 \times 10^9$ Hz the static magnetic field required for ECR is approximately 0.0875 Tesla or 875 gauss. It is also noted that the average cyclotron radius $r_c$ for electrons is given by $$r_c = V_t/\omega_b$$

where $V_t$ is the rms thermal velocity of the electron gas ($V_t = 3.89 \times 10^3 T_e^{\frac{1}{2}}$ m/sec for electrons). Thus, for plasmas where the electron temperature, $T_e$, is $10^5$ °K. or less the cyclotron radius is less than one millimeter.

Thus, electron acceleration takes place in a small, thin layer (or volume) called an ECR surface, around the magnets 34 and 35. These ECR zones can be observed in the discharge as intensely glowing thin discharge layers resulting from the gas excitation by the accelerated electrons.

If the magnets 34 and 35 are strong enough, the ECR zone (or surface) occurs within the discharge region 16. The dotted lines 53 and 53a in FIG. 1 and 3 show examples of such ECR zones (or surfaces) located in the plasma region of the quartz dish 15. As can be observed from these figures these zones 53 and 53a trace out a three dimensional surface within the region 16. Whenever an electron passes through this surface it experiences an energy gain from the time varying electromagnetic field if the electric field has a component perpendicular to the static magnetic field lines. Thus, an electron will move through the discharge by reflecting from magnetic cusp (16a or 16b) to magnetic cusp and gaining energy each time it passes through an ECR surface. Most electrons then give up energy via collisions throughout the discharge. The ECR zone positions can be varied by increasing or decreasing the strength of the magnets 34, 35, 36 and 38. Increasing the magnetic field strengths moves the ECR surface away from the walls further into the center of the discharge. Decreasing the magnet strengths moves the surface toward the walls of the dish 15 or 15a. It is often desirable to have the ECR surface located entirely within the region 16 as shown in the Figures and not cutting through the quartz dish 15 or 15a.

This method of electron gas heating has been employed in other ion and plasma sources (R. Geller and F. Gugliermotte, U.S. Pat. No. 4,417,178; T. Consoli, L. Saint-Cloud, R. B. Clamart, R. Geller, A. Bernard, U.S. Pat. No. 3,571,734; and R. Geller, IEEE Trans. Nucl. Sci. NS-23, 904 (1976)). However, the present concept differs in cavity tuning, excitation, and geometry, and is able to produce a large, magnetic field free plasma surface in plasma region 16 for ion extraction or plasma processing. Another important difference is that the discharge region and cavity 11 are separate, allowing each to be optimized individually. Thus, the optimization of the discharge volume and shape, and discharge matching are more independent. This produces a highly ionized discharge with densities much greater than the critical density while using very low incident power levels, typically not more than 100 to 200 watts.

Variations of the present technology are many. For example, the cusp magnetic field strengths can be adjusted to provide: (1) ECR surfaces surrounding the entire end and cylindrical side walls of the dish 15 as shown in FIGS. 1 and 2, (2) an ECR surface in one region of the discharge and just a confining magnetic fields in other regions. For instance, ECR zones can be created in the top of the discharge region by magnets 35 while the magnets 34 and 38 provide a confining field. This also can be reversed where magnets 35 produce the confining cusps fields 16b over the top of the discharge and the ring magnets 34 create the ECR zones as well as confining fields.

Other variations of this technology allow magnets 35a and 38a to be placed outside the applicator electromagnetic excitation volume as is shown in FIGS. 5 and 6. Also, the applicator sliding short 12 can be adjusted separately from the end plate magnets 35.

Another variation of this technology, shown in FIGS. 7 and 8, encloses all sides of the disk shaped discharge region 16e with magnetic cusps. As shown, the base 30a is also enclosed with an array of permanent magnets 47 except for a central region where a magnet is removed to form the opening 48 (where the magnetic field is deliberately reduced). High energy electrons accelerated via ECR in the discharge will escape through this low magnetic field region of the opening 48 i.e., a magnetic nozzle is produced. The electrons will in turn pull by electrostatic forces the heavier lower energy ions along through the opening 48 of the nozzle producing a neutral beam of charged particles. This neutral beam 49 can then be used for material processing, space engine acceleration, and the like. An advantage of this configuration is that the neutral, high density beam can be produced without the need for the usual grid optics of FIG. 9.

An important feature of this ion and plasma source is its ability to match (i.e., operate with zero or very little reflected power) the incident microwave power into the low, variable pressure (~10 micron) disk plasma region 16 for many different discharge conditions. Variable cavity 11 length and variable coupling probe 14 tuning allow the discharge to be matched over a wide range of discharge pressure, input powers, gas flows and gas mixtures, etc. This match is accomplished using single mode or controlled mutlimode excitation and hence is accomplished without altering either the plasma shape or the applied electromagnetic field patterns and without losing microwave power in external tuning stubs (not shown). Increases in input power increase the electric and magnetic field strengths, however, the geometry of the mode field patterns, remains approximately constant throughout the tuning process keeping the geometry of the fields exciting the plasma region 16, i.e., the electromagnetic focus, constant. Preferably the microwave frequency is between about 400 MegaHertz and 10 GigaHertz.

The input impedance of a microwave cavity is given by $$Z_{in} = \frac{P_t + 2j\omega(W_m - W_e)}{\frac{1}{2}|I_o|^2} = R_{in} + jX_{in}$$

where $P_t$ is the total input power coupled into the cavity 11 (which includes metal wall losses as well as the power delivered to the discharge), $W_m$ and $W_e$ are, respectively, the time-averaged magnetic and electric energy stored in the cavity fields and $|I_o|$ is the total input current on the coupling probe. $R_{in}$ and $jX_{in}$ are the cavity 11 input resistance and reactance and represent the complex load impedance as seen by the feed transmission line.

At least two independent adjustments are required to match this load to a transmission line. One adjustment must cancel the load reactance while the other must adjust the load resistance to the characteristic impedance of the feed transmission system. In the cavity 11 the continuously variable probe 14 and end plate 12 tuning provide these two required variations, and together with single mode excitation are able to cancel the discharge reactance and adjust the discharge resistance to equal the characteristic impedance of the feed transmission line.

The internal cavity 11 matching technique employed in the applicator can be understood with the aid of the equivalent circuit shown in FIG. 11. This is a standard circuit representation for a cavity 11 which is connected to a feed waveguide or transmission line and is excited in the vicinity of a single mode resonance. $G_c$, $L_c$ and $C_c$ represent the conductance, inductance and capacitance respectively of the excited mode near resonance and the jX represents the reactive effect of the evanescent modes far from resonance. The coupling probe 14 (or aperture) is represented as the ideal transformer 60 of turns ratio M:L and coupling reactance jX. Both circuit elements and the transformer 60 are drawn with arrows to indicate their variability during the tuning process. At resonance, the capacitive and inductive susceptance cancel resulting in a pure conductive input admittance.

The discharge is ignited by first adjusting the probe 14 and cavity 11 length positions to excite a specific empty cavity 11 resonance and to match the empty cavity 11 applicator to the input transmission system. Microwave power is then applied, absorbed into the cavity 11 without reflection and a discharge is ignited in plasma region 16 even with low input powers of 10–20 W if the pressure in the disk discharge zone is reduced to less than 10 Torr. The presence of the discharge then changes $L_c$, $G_c$, and $C_c$ and adds an additional discharge conductance $G_L$ and susceptance, $jB_L$, to the circuit. That is, in the presence of a discharge in plasma region 16, the equivalent circuit elements become nonlinear functions of many experimental variables. These include discharge gas mix and type, pressure and flow rate, discharge geometry, absorbed microwave power (i.e., electric field strength squared, $E^2$) and discharge properties such as electron density, and collision frequency. The nonlinear behavior of the discharge in region 16 (and hence the behavior of the equivalent circuit element) is exhibited as hysteresis in experimental variables such as input power, tuning, and operating pressure.

The discharge admittance shifts the resonance, unmatching the plasma loaded cavity 11 from the feed transmission line. If the cavity 11 length and coupling probe 12 remain fixed, further increases in incident power result in only a slight increase in absorbed power and a small change in discharge admittance resulting in mismatching and untuning the cavity 11 from resonance. Thus, the presence of the discharge allows only a small portion of the additional incident power into the cavity 11 causing a large increase in reflected power. This limited variation in discharge properties is a fundamental problem associated with sustaining microwave discharges in fixed size and fixed coupling cavities (S. L. Halverson and A. J. Hatch, Appl. Phys. Lett. 14, 79 (1969)). Discharges in these cavities 11 can be only maintained over a very narrow range of discharge loads (discharge densities, volumes, pressures, flow rates, etc.) and thus, these cavity 11 applicators often operate with large reflected powers.

The variable internal cavity 11 matching employed in the apparatus of the present invention provides the variable impedance transformation that allows the discharge to be matched over a wide range of discharge loads. For a given incident power, gas type, gas flow rate, and discharge pressure, i.e., for a given operating condition, the length and probe tuning are varied iteratively until reflected power is reduced to zero. This tuning together with variation of the incident microwave power "pulls" the discharge properties along a discharge "loss line" similar to that described elsewhere for cylindrical discharges (R. M. Fredericks and J. Asmussen, J. Appl. Phys. 42, 3647 (1971); J. Asmussen, R. Mallavarpu, J. R. Hamann, and H. R. Park, Proc. IEE 62, 109 (1974); and R. Mallavarpu, M. C. Hawley and J. Asmussen, IEEE Trans. Plasma Sci. PS-6, 341 (1978));

Typical tuning distances are of the order of several millimeters to one-half centimeter and thus, the tuning process can be quickly performed either manually or with small motors (not shown). The tuning can also be utilized as a simple discharge power control technique. The motors, placed on the sliding short 12 and probe 14 allow length and probe tuning to be performed while the cavity 11 is held at a high potential.

The excitation of a discharge in the presence of a static magnetic field 34, 35 and 38 is more difficult to understand and model than the simple case of a discharge without a static magnetic field. It is well known that linear, cold plasma theory predicts that the equivalent dielectric constant of a gyrotropic plasma (a plasma immersed in a static magnetic field) is a complex dyadic (a tensor of order 2). In such a gyrotropic plasma energy is not only absorbed from an electromagnetic field by the electron gas via electron heavy particle collisions but the discharge electrons also absorb energy at the electron cyclotron resonance. In this later case, energy is efficiently absorbed in the cyclotron resonant zones if the applied electric field has a component perpendicular to the static magnetic field. Thus, in the cavity 11 applicator the applied electric field must have an electric field component tangential to a cyclotron resonant surface. There are many empty cavity 11 modes that can provide such a field over part or most of the ECR surfaces.

Once the discharge is ignited, the cavity 11 mode field patterns change from the empty cavity 11 field geometries due to the presence of the plasma. These changes are difficult to model and calculate especially in this ion source since the static magnetic field varies considerably (from cusp 16a to cusp) over a standing electromagnetic wavelength. However, the probe 14 and sliding short 12 tuning allow optimum, well-matched, discharge conditions to be found empirically. Since the ECR zones makes the plasma very lossy (easily absorbs microwave energy) at low pressure, the operating cavity Q is lower and the cavity 11 tuning becomes simpler.

Excitation of the cavity 11 applicator system with more than one mode is possible if the cavity 11 dimensions and the discharge properties and size are adjusted for a multimode interaction. An obvious example of multimode operation is the excitation of two, empty cavity 11 degenerate modes such as the $TE_{011}$ and $TM_{111}$ modes. However, the presence of the discharge in the plasma region 16 will shift the resonance of these two modes differently removing the degeneracy. Thus, multimode excitation with a discharge must take into account the properties of the discharge. These multimode intersections have been investigated (J. Asmussen, R. Mallavarpu, J. R. Hamann, and H. R. Park, Proc. IEE 62, 109 (1974); and R. Mallavarpu, M. C. Hawley and J. Asmussen, IEEE Trans. Plasma Sci. PS-6, 341 (1978) for a cylindrical cavity 11 applicator and cylindrical discharge in plasma region 16. In practice, "closely spaced" but non-intersecting modes can also interact, especially if each has a low Q (or large excitation bandwidth).

The dashed equivalent circuit of FIG. 11 indicates the modifications of the circuit required to include an extra mode. Multimode excitation may result in practical solutions to discharge excitation such as discharge uniformity. For example, if two TE$_{111}$ modes are excited by the same microwave source and are both separated by 90° in time and space, a circulating polarized electromagnetic mode can be excited in the cavity 11. The rotating field due to this mode then will produce a more uniform discharge.

The present invention is particularly useful for plasma processing of various substrates. This especially includes plasma oxidation, etching and deposition.

As can be seen from the foregoing description, the present invention provides unique plasma generating apparatus. The especially mounted magnets and magnetic cusps produced thereby confine the plasma and preferably produce ECR. Numerous variations will occur to those skilled in the art and it is intended that the present invention be limited only by the hereinafter appended claims.

We claim:

1. A plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a moveable plate means of a non-magnetic metal in the cavity mounted perpendicular to the axis of the chamber and moveable towards and away from the chamber as a sliding short, including a moveable probe connected to and extending inside the coupler for coupling the radio frequency waves to the coupler, wherein movement of the moveable plate means and the probe in the coupler achieves the selected TM or TE mode of resonance of the radio frequency wave in the coupler and varies the resonance of the mode and wherein the radio frequency wave applied to the coupler creates and maintains the plasma at reduced pressures in the shape of an elongate plasma disk perpendicular to and surrounding the central longitudinal axis in the chamber, the improvement which comprises:

(a) a plurality of first magnets mounted on the apparatus around the longitudinal axis of the chamber on a ring of high permeability magnetic material so as to create magnetic cusps in the chamber which aid in confining the plasma in the chamber; and (b) second magnets mounted on the apparatus on a sheet of high permeability magnetic material so as to provide magnetic cusps inside the chamber which aid in confining the plasma in the chamber.

2. A plasma generating apparatus which comprises:

(a) a plasma source employing a radio frequency, including UHF or microwave, wave coupler which is metallic and non-magnetic and in the shape of a hollow cavity which can be excited in one or more TE or TM modes of resonance;

(b) an electrically insulated chamber having a central longitudinal axis and mounted in the coupler;

(c) gas supply means for providing a gas which is ionized to form the plasma in the insulated chamber;

(d) a movable probe connected to and extending inside the coupler for coupling the radio frequency waves to the coupler;

(e) a plurality of first magnets mounted around the longitudinal axis of the chamber on a ring of high permeability magnetic material so as to create magnetic cusps in the chamber which aid in confining the plasma in the chamber;

(f) movable plate means as a sliding short in the cavity which is non-magnetic and metallic mounted perpendicular to the axis and movable towards and away from the chamber;

(g) second magnets mounted on a sheet of high permeability magnetic material and adjacent to the plate means so as to provide magnetic cusps inside the chamber which aid in confining the plasma in the chamber; and wherein movement of the plate means and the probe in the coupler achieves the selected TE or TM mode of resonance of the radio frequency wave in the coupler and varies the resonance of the mode and wherein the radio frequency wave applied to the coupler creates and maintains the plasma at reduced pressures in the shape of an elongate plasma disk perpendicular to and surrounding the central longitudinal axis in the chamber which is confined in the chamber by the magnetic cusps.

3. The apparatus of claim 2 wherein an ion attracting means is mounted adjacent an opening in the chamber to remove ions from the chamber.

4. The apparatus of claim 2 wherein a support means is mounted adjacent to an opening in the chamber for providing a surface to be treated in the plasma.

5. The apparatus of claim 2 wherein some of the first magnets mounted around the cavity adjacent the chamber form connecting magnetic cusps with the second magnets on the moveable metal plate.

6. The apparatus of claim 5 wherein the first magnets are mounted inside the chamber and are covered with a thin non-magnetic material so as to seal the magnets inside the chamber from charged and energetic species of the plasma.

7. The apparatus of claim 2 wherein the second magnets are mounted on the moveable metal plate adjacent the chamber.

8. The apparatus of claim 2 wherein the second magnets are mounted on or adjacent to the moveable metal plate with a thin section of the metal plate between the magnets and the chamber.

9. The apparatus of claim 2 wherein the high magnetic permeable material is iron.

10. The apparatus of claim 2 wherein the second magnets and sheet essentially cover the metal plate.

11. The apparatus of claim 10 wherein the chamber has an opening and wherein additional magnets are mounted around the opening to provide a magnetic nozzle from the chamber.

12. The apparatus of claim 1 wherein the first and second magnets are permanent rare earth magnets having a field strength of between about 0.01 and 0.5 Tesla such that electron cyclotron resonance can be achieved in the chamber.

13. The apparatus of claim 1 wherein the magnets are electromagnets which provide a variable field strength and thus produces variable electron cyclotron resonance zones in the chamber.

14. A method for forming a plasma which comprises:

(a) providing plasma generating apparatus including a plasma source employing a radio frequency, including UHF or microwave, wave coupler of a non-magnetic metal in the shape of a hollow cavity which can be excited in one or more TE or TM modes of resonance, including an electrically insulated chamber having a central longitudinal axis and mounted in the coupler, including a gas supply means for providing a gas which is ionized to form the plasma in the chamber, including a movable plate means of a non-magnetic metal in the cavity mounted perpendicular to the axis of the chamber and moveable towards and away from the chamber as a sliding short, including a moveable probe connected to and extending inside the coupler for coupling the radio frequency waves to the coupler, wherein movement of the moveable plate means and the probe in the coupler achieves the selected TM or TE mode of resonance of the radio frequency wave in the coupler and varies the resonance of the mode and wherein the radio frequency wave applied to the coupler creates and maintains the plasma at reduced pressures in the shape of an elongate plasma disk perpendicular to and surrounding the central longitudinal axis in the chamber, the improvement which comprises: a plurality of first magnets mounted on the apparatus around the longitudinal axis of the chamber on a ring of high permeability magnetic material so a to create magnetic cusps in the chamber which aid in confining the plasma in the chamber; and second magnets mounted on the apparatus on a sheet of high permeability magnetic material so as to provide magnetic cusps inside the chamber which aid in confining the plasma in the chamber; and (b) forming the plasma disk in the chamber confined by the magnetic cusps.

15. The method of claim 14 wherein the magnets are permanent rare earth magnets having a field strength between about 0.01 and 0.5 Tesla and wherein the microwave frequency is between about 400 MegaHertz and 10 GigaHertz.

16. The method of claim 15 wherein the apparatus is operated at electron cyclotron resonance in the chamber.

17. The method of claim 15 wherein the field strength is about 875 gauss and the frequency is about 2.45 GigaHertz.

18. The method of claim 15 wherein the electron cyclotron resonance creates an accelerating electron cyclotron resonance surface entirely inside the chamber.

19. The method of claim 18 wherein the electron cyclotron resonance surface is positioned in the chamber by varying the strength and position of the magnets relative to the chamber.

20. The method of claim 16 wherein the electron cyclotron resonance facilitates generation of the plasma in the chamber at low pressures of less than about 10 microns in the chamber.

21. The method of claim 16 wherein the plasma generated in the chamber produce charged species having enhanced properties as a result of the electron cyclotron resonance.

22. The method of claim 14 wherein the magnets are electromagnets which provide a variable field strength.

23. A method for forming a plasma which comprises:
(a) providing a plasma generating apparatus which comprises a plasma source employing a radio frequency, including UHF or microwave, wave coupler which is metallic and non-magnetic and in the shape of a hollow cavity and which is excited in one or more TE or TM modes of resonance; an electrically insulated chamber having a central longitudinal axis and mounted in the coupler; gas supply means for providing a gas which is ionized to form the plasma in the insulated chamber; a plurality of first magnets mounted around the longitudinal axis of the chamber on a ring of high permeability magnetic material so as to create magnetic cusps in the chamber which aid in confining the plasma in the chamber; movable plate means in the cavity which is non-magnetic and metallic mounted perpendicular to the axis and movable towards and away from the chamber; second magnets mounted on a sheet of high permeability magnetic material to provide magnetic cusps inside the chamber which aid in confining the plasma in the chamber; and a movable probe connected to and extending inside the coupler for coupling the radio frequency waves to the coupler, wherein movement of the plate means and the probe in the coupler achieves the selected TE or TM mode of resonance of the radio frequency wave in the coupler and varies the resonance of the mode, wherein the radio frequency wave applied to the coupler creates and maintains the plasma at reduced pressures in the shape of an elongate plasma disk perpendicular to and surrounding the central longitudinal axis in the chamber which is confined in the chamber by the magnetic cusps and wherein the magnets have a field strength and position adjacent to or around the chamber sufficient to create electron cyclotron resonance in the chamber; and (b) forming the plasma disk in the chamber confined by the magnetic cusps.

24. The method of claim 23 wherein the apparatus has an ion attracting means adjacent an opening in the chamber and ions are removed from the plasma.

25. The method of claim 23 wherein the apparatus has a support means adjacent an opening in the chamber and a surface to be treated is provided in the plasma.

26. The method of claim 23 wherein plasma which is formed is used for plasma processing of substrates.

27. The method of claim 23 wherein the plasma formed has multimode excitation to provide a more uniform plasma discharge.

* * * * *